US010763153B2

(12) United States Patent
Tashiro et al.

(10) Patent No.: US 10,763,153 B2
(45) Date of Patent: Sep. 1, 2020

(54) HOLDING APPARATUS

(71) Applicants:ULVAC, INC., Kanagawa (JP);
ULVAC CRYOGENICS INC.,
Kanagawa (JP)

(72) Inventors: Yukihito Tashiro, Kanagawa (JP);
Junichi Itoh, Kanagawa (JP); Hidenori Fukumoto, Kanagawa (JP); Kosuke Hidaka, Kanagawa (JP); Mitsuki Terashima, Kanagawa (JP)

(73) Assignees: Ulvac, Inc., Kanagawa (JP); Ulvac Cryogenics Inc., Kanagawa (JP)

(*) Notice: Subject to any disclaimer, the term of this patent is extended or adjusted under 35 U.S.C. 154(b) by 22 days.

(21) Appl. No.: 16/068,504

(22) PCT Filed: May 26, 2017

(86) PCT No.: PCT/JP2017/019685
§ 371 (c)(1),
(2) Date: Jul. 6, 2018

(87) PCT Pub. No.: WO2017/221631
PCT Pub. Date: Dec. 28, 2017

(65) Prior Publication Data
US 2019/0103301 A1 Apr. 4, 2019

(30) Foreign Application Priority Data

Jun. 23, 2016 (JP) ................. 2016-124984

(51) Int. Cl.
*H01L 21/687* (2006.01)
*H01L 21/67* (2006.01)
(Continued)

(52) U.S. Cl.
CPC .. *H01L 21/68785* (2013.01); *H01J 37/32715* (2013.01); *H01L 21/67109* (2013.01);
(Continued)

(58) Field of Classification Search
CPC .......... H01J 37/32715; H01J 37/32724; H01L 21/68; H01L 21/683; H01L 21/6838; H01L 21/68785
See application file for complete search history.

(56) References Cited

U.S. PATENT DOCUMENTS

2001/0021571 A1* 9/2001 Koma ............... H01L 21/02013
438/459
2002/0139307 A1* 10/2002 Ryding ................. C23C 14/505
118/730
(Continued)

FOREIGN PATENT DOCUMENTS

JP 2002-268070 A 12/2002
JP 2008-231513 A 10/2008
(Continued)

OTHER PUBLICATIONS

International Search Report and Written Opinion for PCT Patent App. No. PCT/JP2017/019685 (dated Aug. 22, 2017) with English translation of the ISR.

*Primary Examiner* — Tyrone V Hall, Jr.
(74) *Attorney, Agent, or Firm* — Cermak Nakajima & McGowan LLP; Tomoko Nakajima

(57) ABSTRACT

There is provided a holding apparatus which is capable of rotatably holding, while cooling to a cryogenic temperature, a to-be-processed object in a vacuum chamber. A holding apparatus for rotatably holding, while cooling, a to-be-processed object in a vacuum chamber Vc, has a stage on which the to-be-processed object is placed, a rotary drive device for rotatably supporting the stage, and a cooling device for cooling the stage. Provided that a stage surface side on which the to-be-processed object is placed is defined as an upside, the rotary drive device has: a tubular rotary shaft body which is mounted on a wall surface of the vacuum chamber, in a penetrating manner, through a first (Continued)

vacuum seal; a connection member for connecting an upper end part of the rotary shaft body and a lower surface of the stage in a manner to define a space below the stage; and a driving motor for driving to rotate the rotary shaft body.

6 Claims, 3 Drawing Sheets

(51) Int. Cl.
 *H01J 37/32* (2006.01)
 *H01J 37/34* (2006.01)
(52) U.S. Cl.
 CPC .. *H01L 21/68792* (2013.01); *H01J 37/32733* (2013.01); *H01J 37/3488* (2013.01); *H01L 21/67098* (2013.01)

(56) References Cited

U.S. PATENT DOCUMENTS

| | | | |
|---|---|---|---|
| 2005/0175952 A1* | 8/2005 | Toba | H01L 21/67109 432/241 |
| 2008/0073324 A1* | 3/2008 | Nogami | H01L 21/02087 216/58 |
| 2008/0226838 A1 | 9/2008 | Nishimura et al. | |
| 2010/0244350 A1 | 9/2010 | Fujisato et al. | |
| 2011/0272278 A1* | 11/2011 | Sugi | C23C 14/225 204/298.06 |
| 2013/0113169 A1* | 5/2013 | Sugi | H01L 21/6831 279/128 |
| 2015/0357214 A1* | 12/2015 | Ishizaki | C23C 14/225 165/80.2 |
| 2016/0064189 A1* | 3/2016 | Tandou | H01J 37/3244 156/345.33 |
| 2016/0071707 A1 | 3/2016 | Furukawa et al. | |

FOREIGN PATENT DOCUMENTS

| | | |
|---|---|---|
| JP | 2010-219354 A | 9/2010 |
| JP | 2011-246759 A | 12/2011 |
| JP | 2016-053202 A | 4/2016 |

* cited by examiner

HOLDING APPARATUS

This application is a national phase entry under 35 U.S.C. § 371 of PCT Patent Application No. PCT/JP2017/019685, filed on May 26, 2017, which claims priority under 35 U.S.C. § 119 to Japanese Patent Application No. 2016-124984, filed Jun. 23, 2016, both of which are incorporated by reference.

TECHNICAL FIELD

The present invention relates to a holding apparatus for rotatably holding, while cooling, a to-be-processed object or an object to be processed in a vacuum chamber in vacuum atmosphere.

BACKGROUND ART

In case various kinds of processing such as film forming processing, etching processing, and the like is performed on a to-be-processed object such as silicon wafer, glass substrate, and the like in a vacuum chamber in vacuum atmosphere, it has conventionally been known to perform such processing in a state in which the to-be-processed object is electrostatically attracted by an electrostatic chuck. Here, in performing the processing on the to-be-processed object, there are cases where the to-be-processed object is maintained at a predetermined temperature or the to-be-processed object is maintained at a predetermined temperature which is lower than the room temperature. Then, it is known: to provide a base for supporting a chuck plate which constitutes an electrostatic chuck with a water flow pipe; during processing, to cause cooling water to circulate through this water flow pipe by a cooling water circulation apparatus to thereby cool the base; in this manner to cool the chuck plate and, consequently, the to-be-processed object (see, for example, Patent Document 1).

On the other hand, as a predetermined processing, in case film forming processing is performed by, e.g., sputtering a sputtering target, for the purpose, e.g., of increasing the in-plane uniformity of film thickness distribution or of forming a film on a substrate having a projection/depression shape, it is also known to connect a rotary shaft of a driving motor to a stage on which the to-be-processed object is placed in position. During processing, the stage and consequently the to-be-processed object is processed while rotating it at a predetermined speed (see, for example, Patent Document 2). By the way, in the art described in Patent Document 2, the stage is provided with an electrode for the electrostatic chuck for the to-be-processed object and with a jacket for circulating water. It is thus so arranged that the to-be-processed object is held in a manner to be rotatable and is also capable of being cooled to a predetermined temperature.

However, in each of the methods of the above-mentioned conventional examples in which a liquid such as cooling water and the like is circulated inside the stage as a coolant, despite an attempt to cool the to-be-processed object to a temperature below room temperature, there was a limit in that the to-be-processed object could be cooled down to a temperature of at most about −30° C. In addition, during the processing, should the coolant leak from the stage that is driven for rotation into the vacuum chamber in vacuum atmosphere, not only is the normal processing impaired, but also is the possibility of the processing apparatus itself be damaged. Therefore, it is necessary to employ a complete watertight construction, this bringing about a complication and higher cost of the apparatus.

PRIOR ART DOCUMENTS

Patent Documents

Patent Document 1: JP2002-368070 A
Patent Document 2: JP2011-246759 A

SUMMARY OF THE INVENTION

Problems that the Invention is to Solve

In view of the above points, this invention has a problem in providing a holding apparatus which is capable of rotatably holding, while cooling to a cryogenic temperature, a to-be-processed object in a vacuum chamber.

Means for Solving the Problems

In order to solve the above-mentioned problems, a holding apparatus HS for rotatably holding, while cooling, a substrate W as a to-be-processed object in a vacuum chamber, comprises: a stage on which the to-be-processed object is placed, a rotary drive means for rotatably supporting the stage, and a cooling means for cooling the stage. Provided that a stage surface side on which the to-be-processed object is placed in position is defined as an upside, the rotary drive means has: a tubular rotary shaft body which is mounted on a wall surface of the vacuum chamber, in a penetrating manner, through a first vacuum seal; a connection member for connecting an upper end part of the rotary shaft body and a lower surface of the stage in a manner to define a space below the stage; and a driving motor for driving to rotate the rotary shaft body. The cooling means has: a cooling panel disposed in the space in a manner to face, with a clearance to, the lower surface of the stage; a heat transfer shaft body which is inserted into an inside of the rotary shaft body in a manner to come into contact with the lower surface of the cooling panel; and a refrigerator for refrigerating the heat transfer shaft body.

According to this invention, when the rotary shaft body is driven for rotation by the driving motor which is disposed outside the vacuum chamber, the stage that is connected through the connection member to the rotary shaft body is driven for rotation. Therefore, the to-be-processed object can be held by the stage in a manner freely rotatable. If the stage is provided with a so-called electrostatic chuck or a mechanical clamp, there will be no disadvantage in that the to-be-processed object gets detached out of position during the rotation of the stage. In addition, since the stationary cooling panel is disposed in the space below the stage in a manner to face, with a clearance to, the lower surface of the stage, the stage will be cooled by the radiation from the cooling panel that faces the stage. In this case, since the arrangement is not of the type to circulate cooling water through the heat transfer shaft body and the cooling panel, there will be no disadvantage in that the leaking cooling water impairs normal processing, or causes damages to the processing apparatus itself. By the way, the vertical clearance between the stage and the cooling panel may be appropriately set depending on the temperature of the to-be-processed object to be cooled, presence or absence of heat input, at the time of processing, into the to-be-processed object, and the like. Further, as described later, in case the above-mentioned space that is in vacuum atmosphere (or under vacuum heat insulation) is supplied with the inert gas, the vertical clearance is appropriately determined taking into consideration the vacuum degree (pressure) inside the space, mean free path of the inert gas (atoms and molecules) and the like.

In this invention, the holding apparatus preferably further comprises: a second vacuum seal for isolating the space below the stage from an inner space of the rotary shaft body so as to enable to maintain in vacuum atmosphere the space below the stage; and a gas supply means for supplying the clearance between the stage and the cooling panel with an inert gas. The gas supply means has a gas passage disposed in communication with the heat transfer shaft body and the cooling panel respectively. A gas supply port of the gas passage is disposed to open toward that facing surface of the cooling panel which faces the stage. According to this arrangement, in addition to the cooling by the radiation of the cooling panel, the stage advantageously comes to be cooled further by heat exchange as a result of collision, against the stage, of the inert gas supplied to the above-mentioned clearance. At this time, the inert gas will be cooled while passing through the heat transfer shaft body and the cooling panel in cryogenic state, the cooling effect of the stage due to the collision of the inert gas can be enhanced further. By the way, in order to make the inner space of the rotary shaft body through which the heat transfer shaft body penetrates, into vacuum atmosphere (i.e., vacuum heat insulation), it is preferable to dispose a third vacuum seal, e.g., between the rotary shaft body and the refrigerator.

In case the cooled inert gas is supplied through the gas passage of the heat transfer shaft body and the cooling panel to the above-mentioned space, the gas supply port will be positioned in the central region of the lower surface of the stage. On the other hand, the cooled inert gas has a tendency to flow immediately downward. Under the circumstances, the farther outward goes toward the outer edges of the stage, the inert gas has the possibility of not colliding with the lower surface of the stage. As a solution in this invention, preferably, a lower surface of the stage has a first projection/depression shape in which projections and depressions are repeated in a vertical direction, and an upper surface of the cooling panel has a second projection/depression shape so arranged that the clearance becomes equal over an entire surface to correspond to the first projection/depression shape. According to this arrangement, when the inert gas is supplied from the gas supply port that is positioned in the central region of the lower surface of the stage, the inert gas flows toward the outer edges of the stage. At this time, by causing the inert gas to flow over the steps by the projection/depression shape of the cooling panel, the inert gas can surely be made to collide so far away with the outer edges of the stage.

In case the cooling panel and the refrigerator are connected together through the heat transfer shaft body of a predetermined length so that the cooling panel is cooled by heat transmission, the above-mentioned clearance will be excessively expanded due to thermal contraction of the heat transfer shaft body at the time of cooling. As a consequence, the stage may not be efficiently cooled by radiation from the cooling panel. As a solution, in this invention the holding apparatus preferably further comprises a driving means for integrally moving up and down the heat transfer shaft member and the cooling panel relative to the rotary shaft body. According to this arrangement, the above-mentioned clearance can advantageously be adjusted depending on the thermal contraction of the heat transfer shaft body. Further-more, in case the stage is not rotated, the cooling panel can be made to come into contact with the lower surface of the stage, thereby making it possible to effectively cool the stage.

Further, it is preferable to interpose thermal insulating material between the first vacuum seal and the connection member. According to this invention, in case there is used a magnetic fluid seal which serves dual purposes also of a bearing for the rotary shaft body, the possibility of disadvantage of damaging the magnetic fluid seal due to cooling thereof can be prevented.

MODES FOR CARRYING OUT THE INVENTION

With reference to the drawings, a description will now be made of a holding apparatus, as an embodiment of this invention, which rotatably holds, while cooling in a vacuum chamber, a silicon wafer (hereinafter referred to as "substrate W") being defined as a to-be-processed object. In the following, provided that a holding device in a posture as shown in FIG. 1 is disposed on a bottom side of a vacuum chamber, the terms denoting the directions such as upper/top, lower/bottom, etc. are based on FIG. 1 as a basis.

Figure 1:
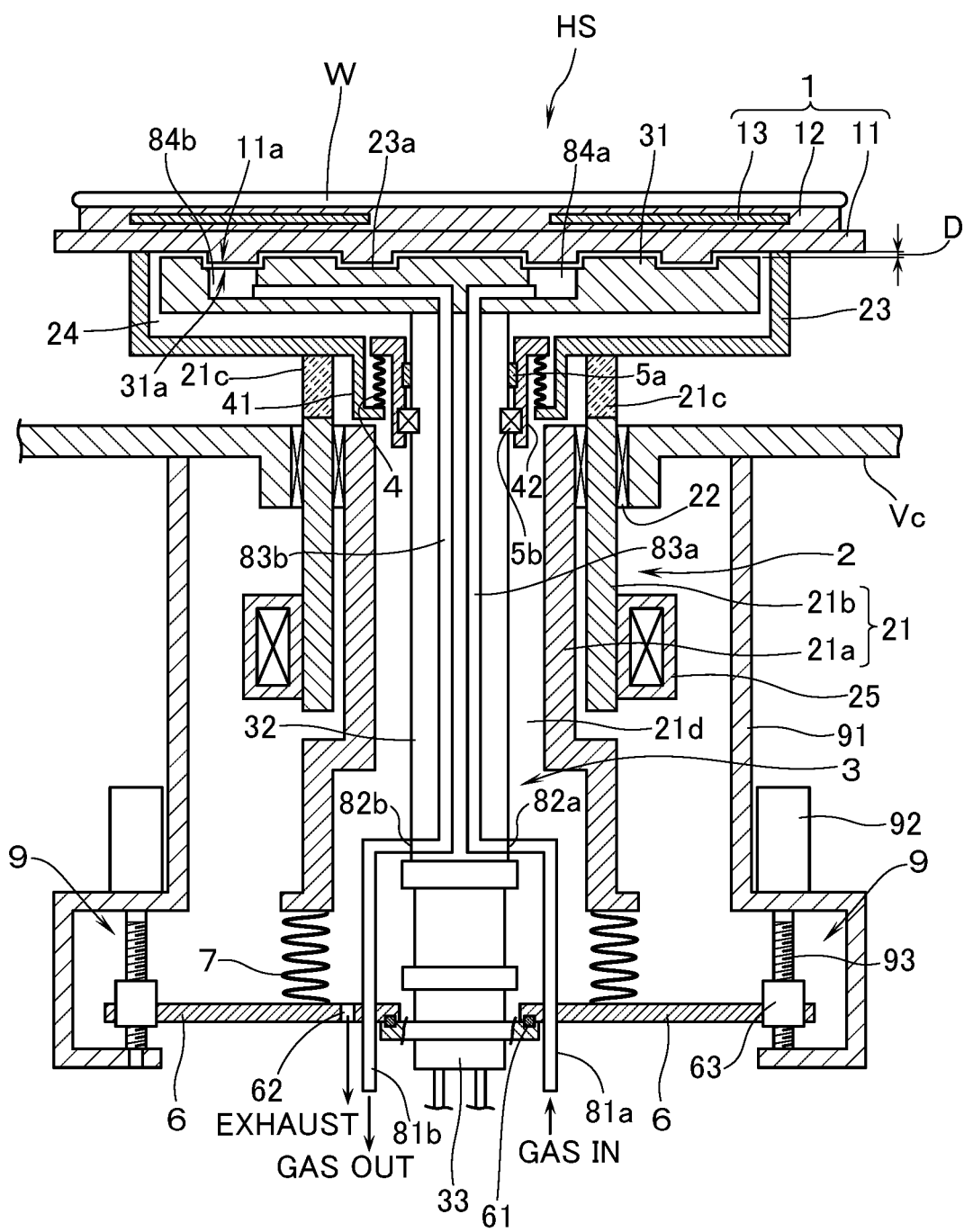
FIG. 1 is a schematic sectional diagram partly illustrating a vacuum chamber having a holding apparatus according to an embodiment of this invention.

With reference to FIG. 1, reference mark Vc denotes a vacuum chamber which is provided with a holding apparatus HS of this embodiment. The vacuum chamber Vc has connected thereto, although not particularly explained by illustrating, a vacuum pump through an exhaust pipe so as to be evacuated to a predetermined pressure (vacuum degree) to thereby hold it at the pressure. Further, inside the vacuum chamber Vc there is disposed a processing means (not illustrated) such as a sputtering cathode, and the like for performing a predetermined processing. Predetermined processing on the substrate W is thus arranged to be performed on the substrate W in the vacuum chamber Vc in the vacuum atmosphere. Further, there is disposed the holding apparatus HS so that, during the processing, the substrate W can be held in a rotatable manner in the vacuum chamber Vc.

The holding apparatus HS is provided with: a stage 1 on which the substrate W is placed in position; a rotary drive means 2 for rotatably supporting the stage 1; and a cooling means 3 for cooling the stage 1. The stage 1 has: a base 11 the profile of which corresponds to the substrate W and which is constituted by a material with good thermal conductivity (e.g., aluminum); and a chuck plate 12 as a dielectric to be disposed on an upper surface of the base 11 through an indium sheet (not illustrated). An electrode 13 for an electrostatic chuck is assembled in the chuck plate 12. According to this arrangement, it is so arranged that, by supplying electric power from a chuck power source (not illustrated), the substrate W can be electrostatically attracted to the upper surface of the stage 1.

The rotary drive means 2 is provided with a tubular rotary shaft body 21. The rotary shaft body 21 is constituted by a stationary inner tube part 21a, and an outer tube part 21b which is coaxially inserted onto an outside of the inner tube part 21a. In order for the outer tube part 21b to be rotatable by the driving motor, which is described later, the outer tube part 21b is rotatably supported by a magnetic fluid seal 22 as a first vacuum seal disposed in a bottom wall opening of the vacuum chamber Vc. On an upper end of the outer tube part 21b there is disposed a tubular insulation material 21c. Between the insulation material 21c and an outer rim part of the lower surface of the base 11, there is disposed a dish-shaped connection member 23. It is thus so arranged that a predetermined space 24 is defined between a rear surface of the base 11 and the connection member 23. As the insulation material 21c those made of resin such as polyimide, FRP (Fiber-Reinforced Plastic), and the like, or those made of ceramic material may be used. Further, a so-called hollow servo motor 25 as a driving motor is inserted onto an outside of that portion of the rotary shaft body 21 which is positioned outside the vacuum chamber Vc. By means of the hollow servo motor 25, the outer tube part 21b of the rotary shaft body 21, and consequently the stage 1 that is connected thereto via the connection member 23, are driven for rotation at a predetermined rotational speed. By the way, the kind of the driving motor and the method of rotational driving of the rotary shaft body 21 are not limited to the above, but may utilize other known art such as the one using DC motors, gears, etc.

The cooling means 3 is provided with a cooling panel 31 which is disposed inside the space 24 so as to face the lower surface of the base 11 and also at a clearance D thereto. This cooling panel 31 is supported by a heat transfer shaft body 32 which is inserted into an inside of the inner tube part 21a extending further downward of the outer tube part 21b, the heat transfer shaft body coming into contact with the lower surface of the cooling panel 31. The cooling panel 31 and the heat transmission shaft body 32 are constituted by a material of good heat transmission such as a metal selected from copper and aluminum, or an alloy containing this kind of metal as chief ingredient, and the like. As the cooling panel 31, there is employed a plate-shaped panel having a surface area depending on the temperature to which the substrate W is intended to be cooled and, as the heat transfer shaft body 32, there is employed a solid round bar-shaped shaft body. In this case, that facing surface of the cooling panel 31 which faces the base 11 may be subjected to blackening treatment. That opposite surface of the cooling panel 31 which is on the opposite side of the base 11, and the heat transfer shaft body 32 may be subjected to mirror-finish treatment.

Figure 2:
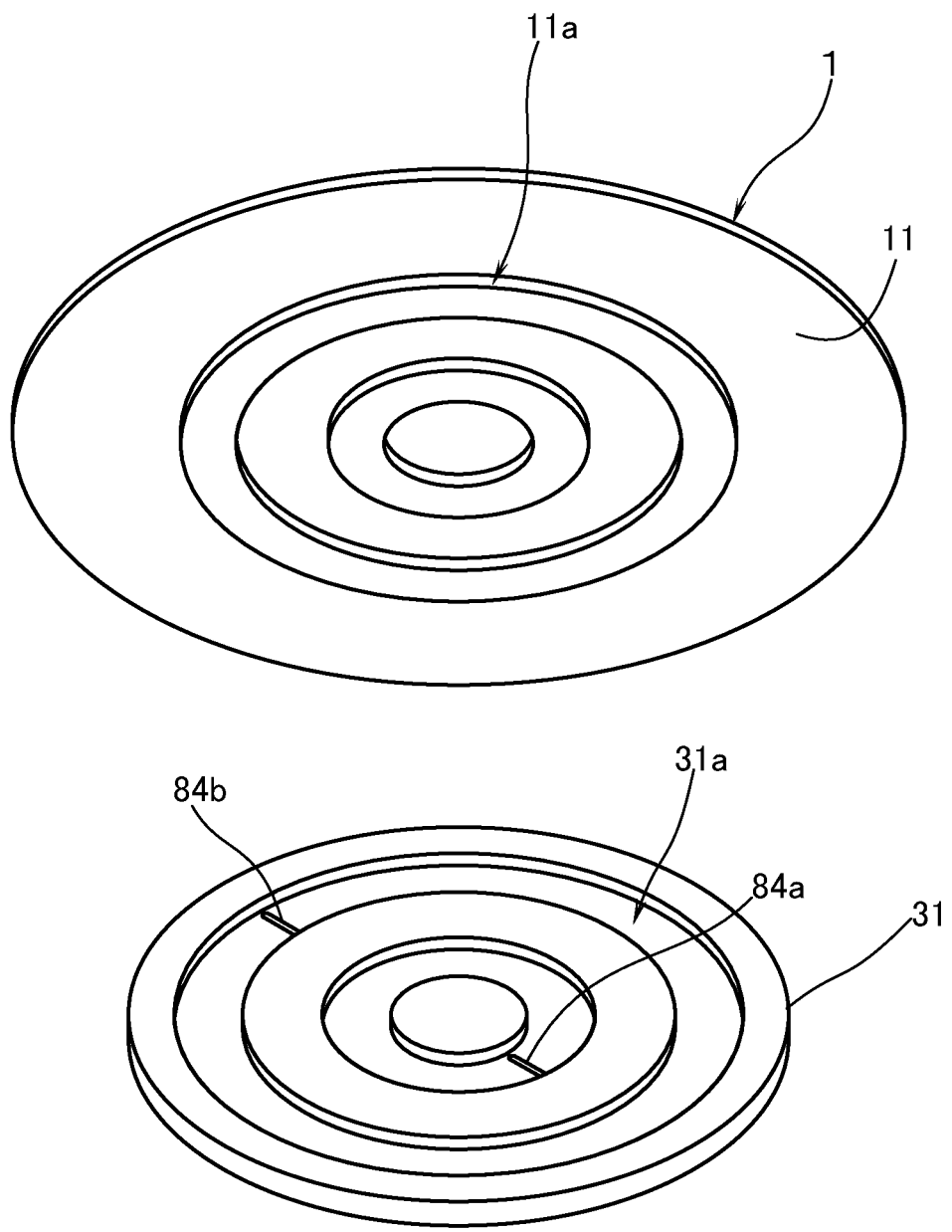
FIG. 2 is a perspective view to explain the shapes of the surfaces of a stage and a cooling panel, respectively.

The lower surface of the base 11 is subjected, as shown in FIG. 2, to a treatment into a first projection/depression shape 11a in which projections and depressions are repeated in a vertical direction. An upper surface of the cooling panel 31 has been subjected to a treatment into a second projection/depression shape 31a so arranged that the clearance D becomes equal over an entire surface so as to correspond to the first projection/depression shape 11a. The lower part of the heat transfer shaft body 32 is connected to a refrigerator 33 that cools the heat transfer shaft body 32. The refrigerator 33, although not explained by particularly illustrating, is provided with a compressor, a condenser, and an expansion valve so that refrigerant from a heat exchanger (not illustrated) is supplied/circulated to a refrigerator 33 for cooling. By the way, since conventional ones may be used as the refrigerator 33 itself, further detailed explanations will be omitted. According to this arrangement, the cooling panel 31 can be cooled, through the heat transfer shaft body 32, to a predetermined temperature (e.g., −200° C.).

In addition, at that upper end part of the heat transfer shaft body 32 which is present inside the vacuum chamber Vc, there is disposed a bellows 4 as a second vacuum seal to isolate the space 24 from the inner space 21d of the rotary shaft body 21. In this case, the bellows 4 is installed in a manner to be held by an outer cylinder part 41 which is suspended from the lower surface of the connection member 23, and by an inner cylinder part 42 which is inserted onto an outside of the heat transfer shaft body 32 through an axis seal 5a and a bearing 5b. It is thus so arranged that, when the rotary shaft body 21 is driven for rotation by the hollow servo motor 25, together with the inner cylinder part 42 and the outer cylinder part 41, the bellows 4 is also rotated relative to the heat transfer shaft body 32. Further, in that housing portion of the refrigerator 33 which is positioned below the lower end of the inner tube part 21a of the rotary shaft body 21, there is mounted a disc-shaped partition plate 6 which extends radially outward, in a state of being hermetically sealed by an O-ring 61. Another bellows (third vacuum seal) 7 is disposed between an upper surface of the partition plate 6 and a lower end surface of the inner tube part 21a of the rotary shaft body 21 so that the inner space 21d of the rotary shaft body 21 can be held hermetically sealed. In this case, the partition plate 6 has opened therein an exhaust port 62. It is thus so arranged that, by means of a vacuum pump (not illustrated), the inner space 21d can be evacuated to a predetermined pressure (vacuum degree) and be maintained thereat.

At a lower end part of the heat transfer shaft body 32, there are disposed connection ports 82a, 82b for a gas supply pipe 81a and a gas exhaust pipe 82a, both extending by penetrating the partition plate 6. Each of the connection ports 82a, 82b is respectively communicated with gas passages 83a, 83b which are formed in communication with the heat transfer shaft body 32 and with the cooling panel 31. Both the gas passages 83a, 83b are respectively communicated with a gas supply passage 84a and a gas exhaust passage 84b which are respectively opened on that facing surface of the cooling panel 31 which faces the base 11. Further, the gas supply pipe 81a is connected to a gas source through a mass flow controller (not illustrated), and the inert gas adjusted to a predetermined flow amount is arranged to be supplied to the space 24. As the inert gas, there is used a rare gas such as helium gas, argon gas and the like, or nitrogen gas. On the other hand, the gas exhaust pipe 81b is connected to a vacuum pump (not illustrated) and, prior to the introduction of the inert gas, the space 24 can be evacuated to a predetermined pressure so that the space 24 is subjected to vacuum heat insulation. Or else, while introducing the inert gas into the space 24 in vacuum atmosphere for evacuation, the inert gas can be circulated. Still furthermore, an on-off valve (not illustrated) may be interposed in the gas exhaust pipe 81b so that, after having evacuated the space 24 to a predetermined pressure, the on-off valve is closed and, in this state, the inert gas can be introduced from the gas supply pipe 81a into the space 24, thereby sealing the inert gas in the space. Still furthermore, it may also be so arranged that the inert gas is introduced, in addition to the gas supply pipe 81a, also from the gas exhaust pipe 81b.

Now, in case the stage 1 is cooled by supplying the inert gas into the space 24 in vacuum atmosphere, the vertical clearance D between the base 11 and the cooling panel 31 is appropriately determined taking into consideration the pressure (vacuum degree) inside the space 24, mean free path of the inert gas (atoms and molecules) and the like, in addition to that temperature of the substrate W to which the substrate W is to be cooled, and presence or absence of heat input to the to-be-processed object during processing. That is, depending on the kind of the inert gas, and the pressure inside the space 24, the coefficient of heat transfer in the space 24 can be determined and, depending on this, the distance D is determined.

By the way, in case the cooling panel 31 and the refrigerator 33 are connected to each other through the vertically elongated heat transfer shaft body 32, and the cooling panel 31 is tried to be cooled by heat transfer, depending on the material and length of the heat transfer shaft body 32, there will be a possibility that the above-mentioned clearance D becomes too large due to thermal contraction of the heat transfer shaft body 32 at the time of cooling. The stage 1 cannot therefore be efficiently cooled by the radiation from the cooling panel 31. In this embodiment, there is disposed a drive means 9 for integrally moving up and down the cooling means 3 relative to the rotary shaft body 21. The drive means 9 is disposed in three pieces on the partition plate 6 circumferentially along an outer peripheral side at an interval of 120 degrees. Each of the drive means 9 has the identical constitution and has: a driving motor 92 which is disposed on a frame 91 suspended from a bottom wall of the vacuum chamber Vc; and a feed screw 93 mounted on a rotary shaft of the driving motor 92 such that the feed screw 93 is engaged in a threading manner with sliding members 63 disposed on the partition plate 6. A description will hereinbelow be made in concrete, with reference to FIG. 3, of a method of adjusting the clearance D by using the drive means 9.

Figure 3:
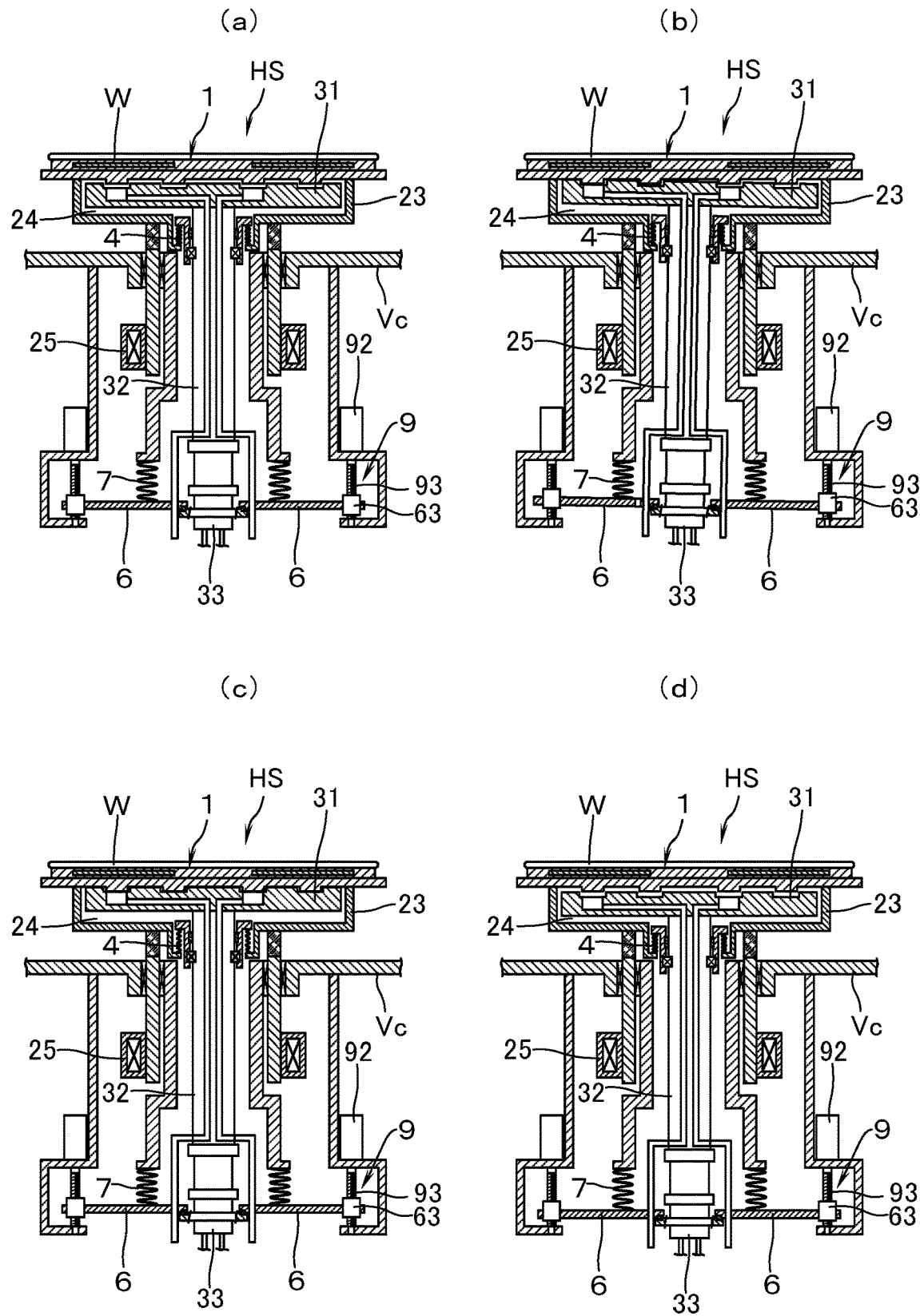
FIGS. 3 (a)~(d) are sectional views, corresponding to FIG. 1, to explain a method of adjusting a clearance between the stage and the cooling panel.

First, the driving motor 92 of each of the drive means 9 is respectively rotated in one direction so as to lower the cooling means 3 to a predetermined position in which the cooling panel 31 is apart from the base 11 (see FIG. 3(*a*)). In this case, the amount of relative movement of the cooling means 3 relative to the rotary shaft body 21 will be absorbed by the bellows 7. The inner space 21*d* of the rotary shaft body 21 therefore remains to be maintained in a hermetically sealed manner. Then, a driving motor 92 of only any one (left side in the figure) of the drive means 9 is driven in the opposite direction. The upper surface of the cooling panel 3 is thus caused to come into partial contact with the lower surface of the base 11. At this time, e.g., out of the variations in torque of the driving motor, detection is made of the fact that the upper surface of the cooling panel 31 has come into partial contact with the lower surface of the base 11. In this state, the driving of said any one of the driving motors 92 of the drive means 9 is stopped (see FIG. 3(*b*)). Then, by performing the above-mentioned operations with the other two drive means 9, there will be attained a state in which the upper surface of the cooling panel 31 is in contact with the lower surface of the base 11 over an entire surface of the base (see FIG. 3(*c*)). Finally, each of the driving motors 92 of the respective drive means 9 is rotated synchronously in one direction at an angle of rotation that depends on the clearance D intended to be set. According to these operations, the clearance D between the upper surface of the cooling panel 31 and the lower surface of the base 11 becomes equal to each other over the entire surfaces (see FIG. 3(*d*)).

According to the above-mentioned embodiment, when the rotary shaft body 21 is driven for rotation by the hollow servo motor 25 that is disposed outside the vacuum chamber Vc, the stage 1 that is connected through the connection member 23 is driven for rotation. Therefore, the substrate W can be held by the stage 1 in a rotatable manner. And since the cooling panel 31 is fixedly disposed in the space 24 below the base 11 in a manner to face the lower surface of the base 11, the stage 1 will be cooled by radiation from the cooling panel 31 that faces the stage 1. At this time, the cooling panel 31 is cooled by heat transfer from the heat transfer shaft body 32 which is inserted into the inside of the rotary shaft body 21 and which is cooled by the refrigerator 33. Therefore, it becomes possible for the stage 1 to be cooled due to heat exchanging as a result of striking, against the stage 1, of the inert gas supplied to the clearance D and, in combination therewith, it becomes possible for the substrate W to be cooled to a cryogenic temperature (e.g., −200° C.) that is lower than the cooling temperature (e.g., −30° C.) in the above-mentioned conventional example. Still furthermore, since the inert gas is cooled while it passes through the heat transfer shaft body 32 in a cryogenic state and the cooling panel 31, the cooling efficiency of the stage 1 due to collision of the inert gas can further be enhanced. In this case, since the arrangement is not of a type to circulate cooling water through the heat transfer shaft body 32 and the cooling panel 31, there will happen no disadvantage in that the leaking cooling water impairs normal processing, or causes damages to the processing apparatus itself.

Further, the lower surface of the base 11 has a first projection/depression shape 11*a* in which projections and depressions are repeated in a vertical direction, and the upper surface of the cooling panel 31 has a second projection/depression shape 31*a* so arranged that the clearance D becomes uniform over the entire surface corresponding to the first projection/depression shape 11*a*. Therefore, when the inert gas is supplied from the gas supply port 84*a* of the cooling panel 31, the inert gas will flow radially outward toward the outer edge direction of the base 11. At this time, however, by causing the inert gas to flow over the steps by the projection/depression shape of the cooling panel 31, the inert gas can surely be made to collide so far away with the outer edges of the stage 11. Further, since the drive means 9 for integrally moving up and down the cooling means 3 relative to the rotary shaft body 21 has been provided, the clearance D can advantageously be adjusted appropriately depending on the thermal contraction, e.g., of the heat transfer shaft body 32. Moreover, in case the stage 1 is not rotated, the cooling panel 31 is caused to contact the lower surface of the base 11 so that effective cooling can be performed. In addition, since the insulating material 21*c* is interposed between the magnetic fluid seal 22 and the connection member 23, a disadvantage in that the magnetic fluid seal 22 is damaged due to cooling can be prevented from occurring.

A description has so far been made of an embodiment of this invention, but this invention shall not be limited to the above. This invention may be appropriately modified within a range in which the concept of this invention is not deviated. In the above-mentioned embodiment, a description has been made of an example in which the stage 1 has been constituted into one with electrostatic chuck function. However, the constitution of the stage shall not be limited to the above, but other conventional ones may also be utilized. Further, the base 11 may also be constituted to be provided with a so-called mechanical chuck. Still furthermore, in the above-mentioned embodiment, a description has also been made of an example in which the cooling panel 31 and the heat transfer shaft body 32 are provided with a gas passage 83*b* and a gas exhaust port 84*b* in order to exhaust the space 24 into vacuum. However, without being limited to the above, an arrangement may, for example, be made that, by drilling a through hole in the connection member 23, the space 24 may be evacuated via this through hole accompanied by the exhausting of the vacuum chamber Vc, or the inert gas supplied to the space 24 may be exhausted.

EXPLANATION OF MARKS

HS holding device
W substrate (to-be-processed object)
Vc vacuum chamber
1 stage
11 base (constituting element of a stage)
11a first projection/depression shape
2 rotary drive means
21 rotary shaft body
21a inner tube part
21b outer tube part
21c insulation material
21d inner space of the rotary shaft body
22 magnetic fluid seal (first vacuum seal)
23 connection member
24 space
25 hollow servo motor (driving motor)
3 cooling means
31 cooling panel
31a second projection/depression shape
32 heat transfer shaft body
33 refrigerator
4 bellows (second vacuum seal)
7 bellows (third vacuum seal)
83a gas passage (constituting element of gas supply means)
84a gas supply port (constituting element of gas supply means)
9 drive means D clearance

The invention claimed is:

1. A holding apparatus for rotatably holding, while cooling, a to-be-processed object in a vacuum chamber, comprising:
a stage on which the to-be-processed object is placed,
a rotary drive means for rotatably supporting the stage, and
a cooling means for cooling the stage;
wherein, provided that a stage surface side on which the to-be-processed object is placed in position is defined as an upside, the rotary drive means has: a tubular rotary shaft body which is mounted on a wall surface of the vacuum chamber, in a penetrating manner, through a first vacuum seal; a connection member for connecting an upper end part of the rotary shaft body and a lower surface of the stage in a manner to define a space below the stage; and a driving motor for driving to rotate the rotary shaft body;
wherein the cooling means has:
a cooling panel disposed in the space in a manner to face, with a clearance to, the lower surface of the stage;
a heat transfer shaft body which is inserted into an inside of the rotary shaft body in a manner to come into contact with the lower surface of the cooling panel, the cooling panel being fixed to the heat transfer shaft body, being not rotatable; and
a refrigerator for refrigerating the heat transfer shaft body.

2. The holding apparatus according to claim 1, further comprising: a second vacuum seal for isolating the space below the stage from an inner space of the rotary shaft body so as to enable to maintain in vacuum atmosphere the space below the stage; and a gas supply means for supplying the clearance between the stage and the cooling panel with an inert gas, wherein the gas supply means has a gas passage disposed in communication with the heat transfer shaft body and the cooling panel respectively, and wherein a gas supply port of the gas passage is disposed to open toward that surface of the cooling panel which faces the stage.

3. The holding apparatus according to claim 1, wherein a lower surface of the stage has a first projection/depression shape in which projections and depressions are repeated in a vertical direction, and wherein an upper surface of the cooling panel has a second projection/depression shape so arranged that the clearance becomes equal over an entire surface to correspond to the first projection/depression shape.

4. The holding apparatus according to claim 1, further comprising thermal insulating material interposed between the first vacuum seal and the connection member.

5. A holding apparatus for rotatably holding, while cooling, a to-be-processed object in a vacuum chamber, comprising:
a stage on which the to-be-processed object is placed,
a rotary drive means for rotatably supporting the stage, and
a cooling means for cooling the stage;
wherein, provided that a stage surface side on which the to-be-processed object is placed in position is defined as an upside, the rotary drive means has: a tubular rotary shaft body which is mounted on a wall surface of the vacuum chamber, in a penetrating manner, through a first vacuum seal; a connection member for connecting an upper end part of the rotary shaft body and a lower surface of the stage in a manner to define a space below the stage; and a driving motor for driving to rotate the rotary shaft body;
wherein the cooling means has:
a cooling panel disposed in the space in a manner to face, with a clearance to, the lower surface of the stage;
a heat transfer shaft body which is inserted into an inside of the rotary shaft body in a manner to come into contact with the lower surface of the cooling panel; and
a refrigerator for refrigerating the heat transfer shaft body;
the holding apparatus further comprising driving means for integrally moving up and down the heat transfer shaft member and the cooling panel relative to the rotary shaft body.

6. A holding apparatus for rotatably holding, while cooling, a to-be-processed object in a vacuum chamber, comprising:
a stage on which the to-be-processed object W is placed,
a rotary drive means for rotatably supporting the stage, and
a cooling means for cooling the stage;
wherein, provided that a stage surface side on which the to-be-processed object is placed in position is defined as an upside, the rotary drive means has: a tubular rotary shaft body which is mounted on a wall surface of the vacuum chamber, in a penetrating manner, through a first vacuum seal; a connection member for connecting an upper end part of the rotary shaft body and a lower surface of the stage in a manner to define a space below the stage; and a driving motor for driving to rotate the rotary shaft body;
wherein the cooling means has:
a cooling panel disposed in the space in a manner to face, with a clearance to, the lower surface of the stage, wherein the clearance is located between an entire surface of the lower surface of the stage and the cooling panel;

a heat transfer shaft body which is inserted into an inside of the rotary shaft body in a manner to come into contact with the lower surface of the cooling panel; and a refrigerator for refrigerating the heat transfer shaft body.

* * * * *